United States Patent
Powers et al.

(10) Patent No.: US 7,126,223 B2
(45) Date of Patent: Oct. 24, 2006

(54) SEMICONDUCTOR DEVICE FORMED WITH AN AIR GAP USING ETCH BACK OF INTER LAYER DIELECTRIC (ILD)

(75) Inventors: James Powers, Aloha, OR (US); Kevin P. O'Brien, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/261,426

(22) Filed: Sep. 30, 2002

(65) Prior Publication Data

US 2004/0061230 A1 Apr. 1, 2004

(51) Int. Cl.
*H01L 23/52* (2006.01)

(52) U.S. Cl. .................... 257/760; 257/776

(58) Field of Classification Search ............. 257/522, 257/758, 760, 776; 438/619
See application file for complete search history.

(56) References Cited

U.S. PATENT DOCUMENTS

| | | | | |
|---|---|---|---|---|
| 5,413,962 A | * | 5/1995 | Lur et al. .................... | 438/619 |
| 5,882,963 A | * | 3/1999 | Kerber et al. ............... | 438/195 |
| 6,064,118 A | * | 5/2000 | Sasaki ........................ | 257/758 |
| 6,091,149 A | * | 7/2000 | Hause et al. ................ | 257/758 |
| 6,184,121 B1 | * | 2/2001 | Buchwalter et al. ........ | 438/622 |
| 6,252,290 B1 | * | 6/2001 | Quek et al. ................. | 257/522 |
| 6,413,852 B1 | * | 7/2002 | Grill et al. .................. | 438/619 |
| 2002/0158337 A1 | * | 10/2002 | Babich et al. .............. | 257/758 |
| 2003/0064577 A1 | * | 4/2003 | Hsu et al. ................... | 438/619 |

\* cited by examiner

*Primary Examiner*—Stephen W. Smoot
(74) *Attorney, Agent, or Firm*—Blakely, Sokoloff, Taylor & Zafman LLP

(57) ABSTRACT

A method is disclosed of forming an air gap using etch back of an inter layer dielectric (ILD) with self-alignment to metal pattern. The method entails forming a first metallization layer deposited on a first dielectric, forming a second metallization layer deposited on a second dielectric, wherein the second metallization layer is spaced apart from the first metallization layer, forming a sacrificial ILD between the first and second metallization layers, forming a diffusion layer over the first and second metallization layers and over the sacrificial ILD, and removing the sacrificial ILD to form an air gap between the first and second metallization layers. This method is particular applicable for dual copper damascene processes.

8 Claims, 7 Drawing Sheets

US 7,126,223 B2

SEMICONDUCTOR DEVICE FORMED WITH AN AIR GAP USING ETCH BACK OF INTER LAYER DIELECTRIC (ILD)

FIELD OF THE INVENTION

An embodiment of the invention relates generally to semiconductor processes, and in particular, to a method of forming an air gap using an etch back of an inter layer dielectric (ILD) with self-alignment to metal pattern.

BACKGROUND OF THE INVENTION

A continuing and ongoing trend in the semiconductor field is the ever-increasing density of circuit components in integrated circuits. More and more circuit components are being designed within a given integrated circuit area. Thus, techniques have been developed to substantially reduce the sizes of active devices, metal lines, and inter layer dielectrics, among other components.

With the reduction of circuit component sizes comes a host of problems due to the closer proximity of circuit components. One such problem is cross-talk or electromagnetic interference between adjacent circuit components. For example, a signal present on a metallization line may interfere with another signal present on an adjacent metallization line. Another problem associated with the close proximity of circuit components is the potential increased signal delay and reduction in frequency bandwidth. That is, the presence of a grounded metallization layer in proximity to a metallization layer carrying a signal may decrease the signal propagation speed leading to possible delay errors. Also, a close proximity grounded layer may reduce the frequency bandwidth of the signal on an adjacent metallization line. These problems stem from the capacitive coupling between adjacent circuit components.

The capacitive coupling between adjacent circuit components is proportional to the relative dielectric constant of the material separating the circuit components and inversely proportional to the distance separating the circuit components. Thus, in order to reduce the capacitive coupling between the adjacent circuit components, the relative dielectric constant of the material separating the circuit components should be decreased and/or the distance separating the two components should be increased. Since the latter is in contradiction with the trend of further miniaturizing of circuits, the viable solution for decreasing capacitive coupling between adjacent circuit components is to use materials with lower relative dielectric constants to separate the circuit components.

Present dual damascene copper integration schemes typically use silicon dioxide ($SiO_2$) or silicon oxyfluoride ($SiOF_x$) as the inter layer dielectric (ILD) material with an underlying etch stop layer (ESL). In order to reduce the capacitive coupling from line-to-line and layer-to-layer, two broad classes of materials with lower relative dielectric constants are being investigated. The first class of material consists of organic ILD materials such as SILK® or FLARE®. The second class of material consists of carbon doped oxides in which the —Si—O—Si—O— matrix of $SiO_2$ is disrupted with the addition of hydrocarbon groups such as $CH_3$. However, these two classes of materials still have relative dielectric constants ranging from 2.8 to 3.3., which in many cases is still undesirably high.

Some in the relevant art are further reducing the relative dielectric constants of materials by developing porous versions of the low dielectric constant materials. The incorporation of air filled voids lowers the dielectric constant of the material, since air or vacuum are the ultimate low capacitance materials. Using this approach, they have reduced the relative dielectric constant of such porous material to 2.0 to 2.4. However, all of these low dielectric constant materials are structurally inferior to $SiO_2$ and $SiOF_x$, which complicates packaging and assembling the integrated circuit die. An embodiment of the invention includes a method for generating air filled gaps between metal lines, further reducing the line-to-line and layer-to layer capacitive coupling.

DETAILED DESCRIPTION

Figure 1A:
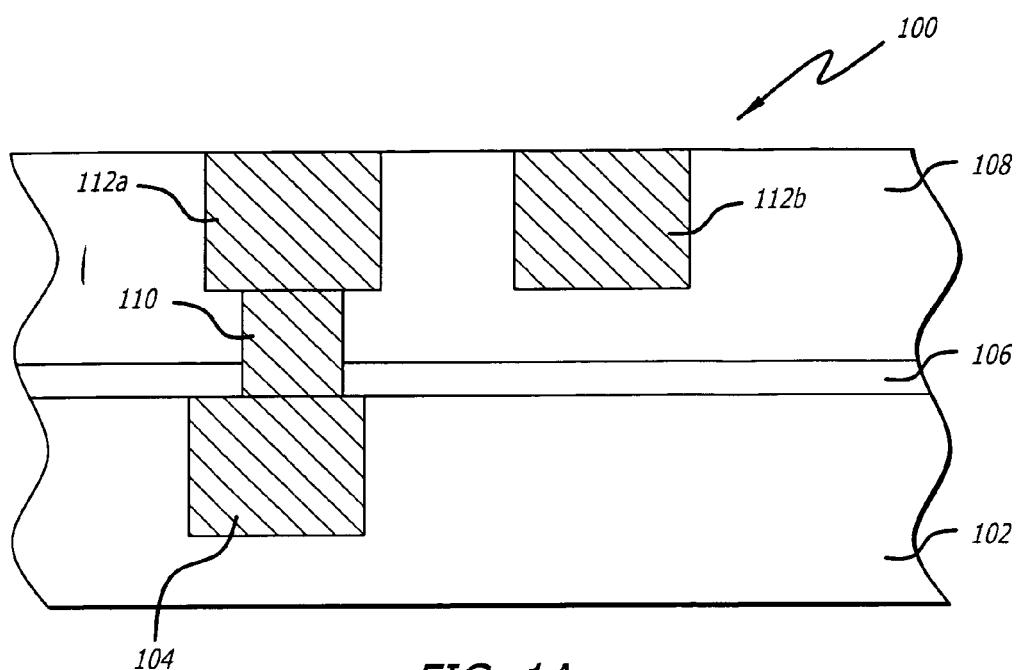
FIGS. 1A–1J illustrate cross-sectional views of an exemplary semiconductor device at various stages of an exemplary method of forming an air gap using an etch back of an inter layer dielectric (ILD) with self-alignment to metal pattern in accordance with an embodiment of the invention.

FIG. 1A illustrates a cross-sectional view of an exemplary semiconductor device 100 at an intermediate stage of an exemplary method of forming an air gap using an etch back of an inter layer dielectric (ILD) with self-alignment to metal pattern in accordance with an embodiment of the invention. At this stage, the semiconductor device 100 has undergone a dual damascene metal processes to form top and bottom metal layers with an interconnect connecting the two metal layers. Specifically, the semiconductor device 100 comprises a first dielectric layer 102 (e.g. silicon dioxide ($SiO_2$)) and a first metallization layer 104 (e.g. copper (Cu)) patterned within the first dielectric layer 102 in accordance with a dual metal damascene process.

The semiconductor device 100 further comprises an etch stop layer (ESL) 106 (e.g. silicon nitride ($Si_3N_4$)) deposited over the first dielectric layer 102, a second dielectric layer 108 (e.g. $SiO_2$) deposited over the ESL 106, second metallization layers 112a–b (e.g. Cu) which are laterally (i.e. in the horizontal direction) spaced apart from each other and both patterned within the second dielectric layer 108 in accordance with a dual metal damascene process, and a via interconnect 110 patterned within the second dielectric layer 108 and the ESL 106, and electrically connecting the second metallization layer 112a to the first metallization layer 104.

Figure 1B:
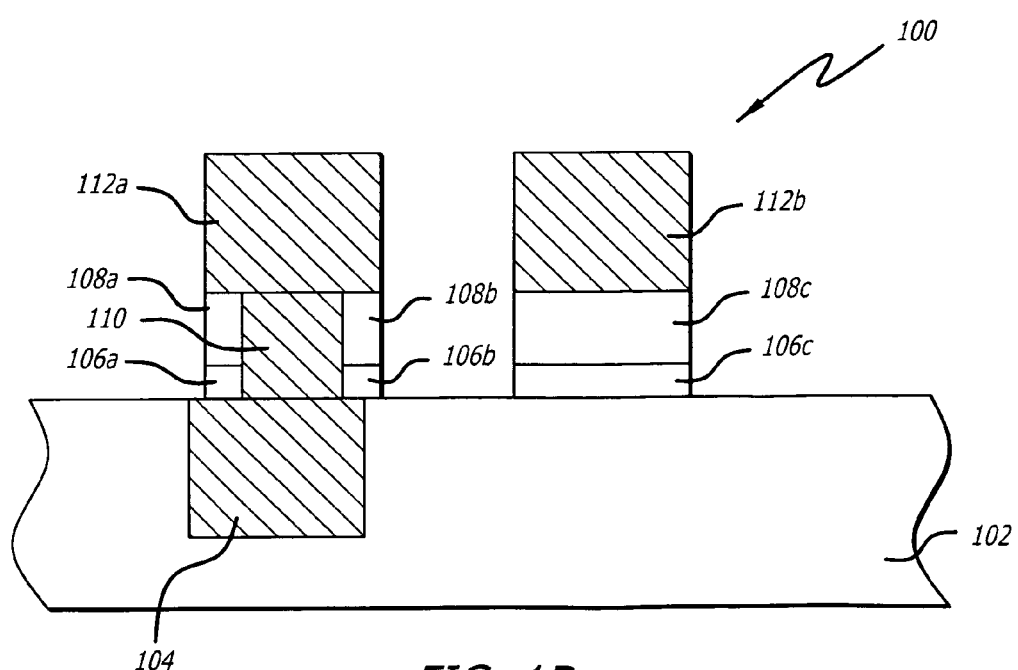

FIG. 1B illustrates a cross-sectional view of the exemplary semiconductor device 100 at a subsequent stage of the exemplary method of forming an air gap using an etch back of an ILD with self-alignment to metal pattern in accordance with an embodiment of the invention. According to the method, the second dielectric layer 108 and the ESL 106 are removed except in the locations underlying respectively the second metallization layers 112a–b. This forms stacked ESL spacers 106a–b and dielectric spacers 108a–b on either side of the via interconnect 110, which assists in supporting the overlying second metallization layer 112a. Also formed is stacked ESL and dielectric supports 106c and 108c for the overlying second metallization layer 112b. An exemplary method of removing the ESL 106 and the second dielectric layer 108 is by an anisotropic etching process.

Figure 1C:
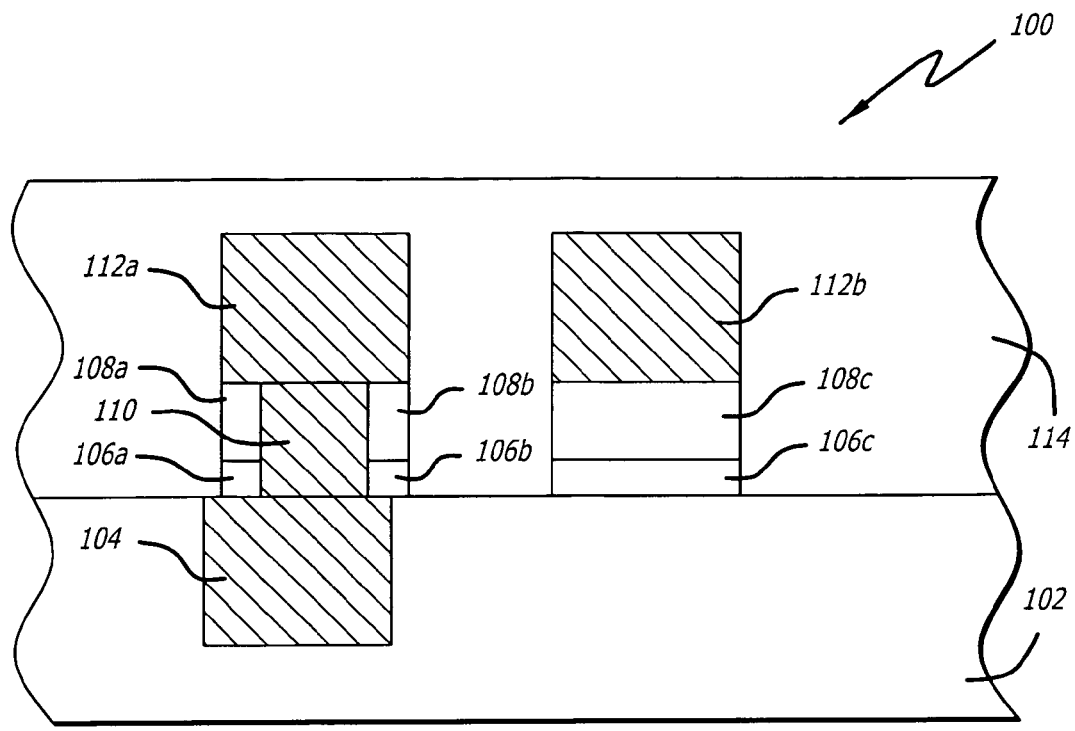

FIG. 1C illustrates a cross-sectional view of the exemplary semiconductor device 100 at a subsequent stage of the exemplary method of forming an air gap using an etch back of an ILD with self-alignment to metal pattern in accordance with an embodiment of the invention. According to the method, a layer of sacrificial ILD 114 is deposited over the first dielectric layer 102 and the second metallization layers 112a–b. An example material for the sacrificial ILD 114 is Unity 400 which is commercially available as a spin on polymer from Promerus LLC. Once the first sacrificial ILD 114 is deposited, it is annealed at approximately 200° C. to remove remaining solvents from the ILD material 114. The annealing of the first ILD 114 improves the stability of the material which is useful for a subsequent etching process to form the interconnect trench. Other materials that can be used for the ILD 114 includes SILK® or FLARE®.

Figure 1D:
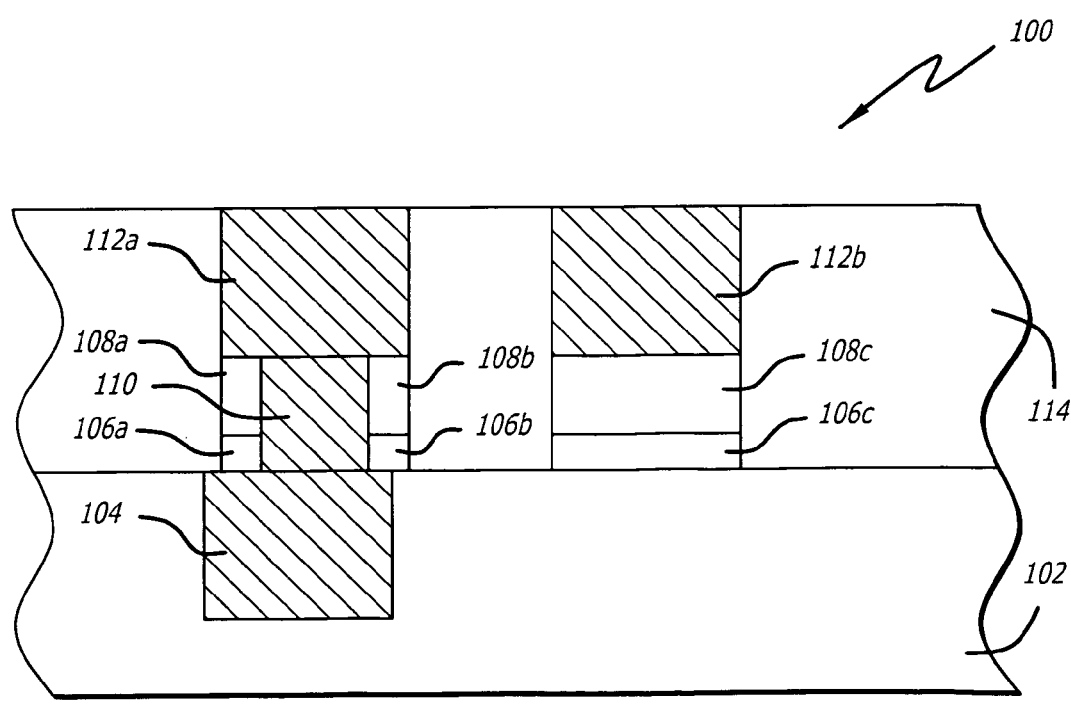

FIG. 1D illustrates a cross-sectional view of the exemplary semiconductor device 100 at a subsequent stage of the exemplary method of forming an air gap using an etch back of an ILD with self-alignment to metal pattern in accordance with an embodiment of the invention. Once the first sacrificial ILD 114 is deposited and annealed, the top surface of the first sacrificial ILD 114 is polished to expose the top surfaces of the second metallization layers 112a–b. In the exemplary implementation of the method, a chemical mechanical polishing (CMP) is performed on the first sacrificial ILD 114.

Figure 1E:
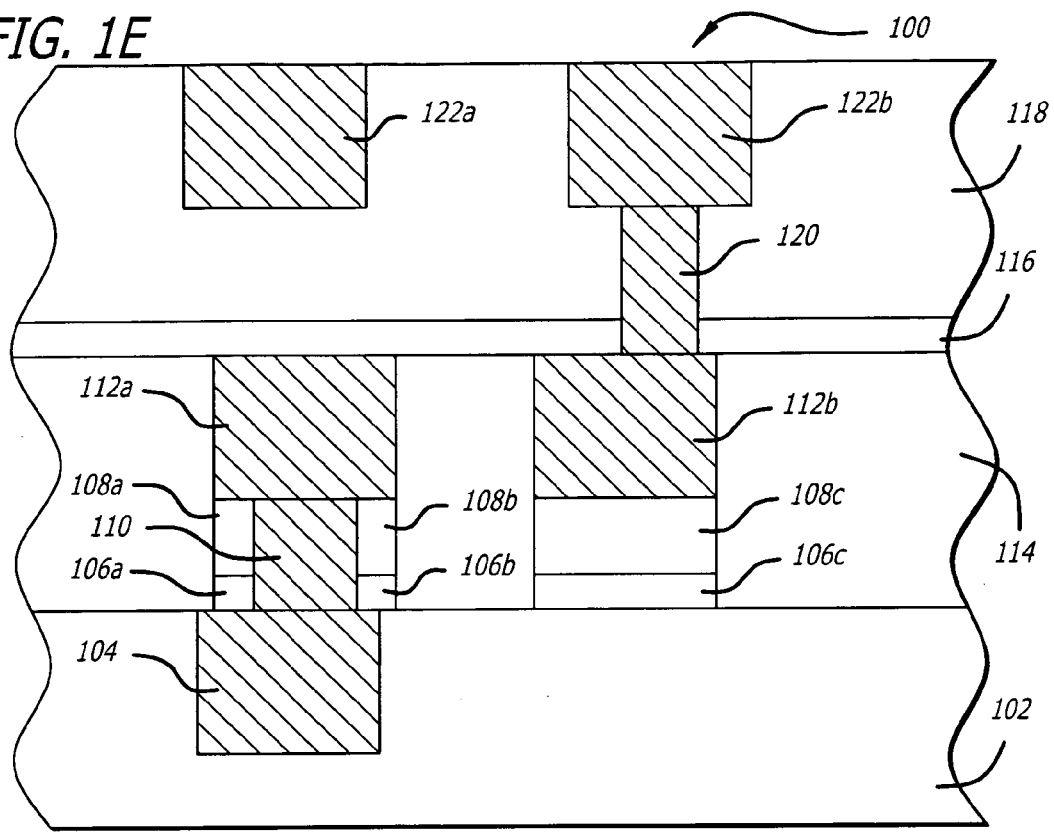

FIG. 1E illustrates a cross-sectional view of the exemplary semiconductor device 100 at a subsequent stage of the exemplary method of forming an air gap using an etch back of an ILD with self-alignment to metal pattern in accordance with an embodiment of the invention. Once the first sacrificial ILD 114 has been polished, a third metallization layer and interconnect are formed above the second metallization layers 112a–b in accordance with a dual metal damascene process. Specifically, the semiconductor device 100 further comprises a second ESL 116 (e.g. $Si_3N_4$) deposited over the sacrificial ILD 114 and the second metallization layers 112a–b, a third dielectric layer 118 (e.g. $SiO_2$) deposited over the second ESL 116, third metallization layers 122a–b (e.g. Cu) which are laterally (i.e. in the horizontal direction) spaced apart from each other and both formed within the third dielectric layer 118 pursuant to a dual metal damascene process, and a via interconnect 120 formed within the third dielectric layer 118 pursuant to a dual metal damascene process, and electrically connecting the third metallization layer 122b to the second metallization layer 112b.

Figure 1F:
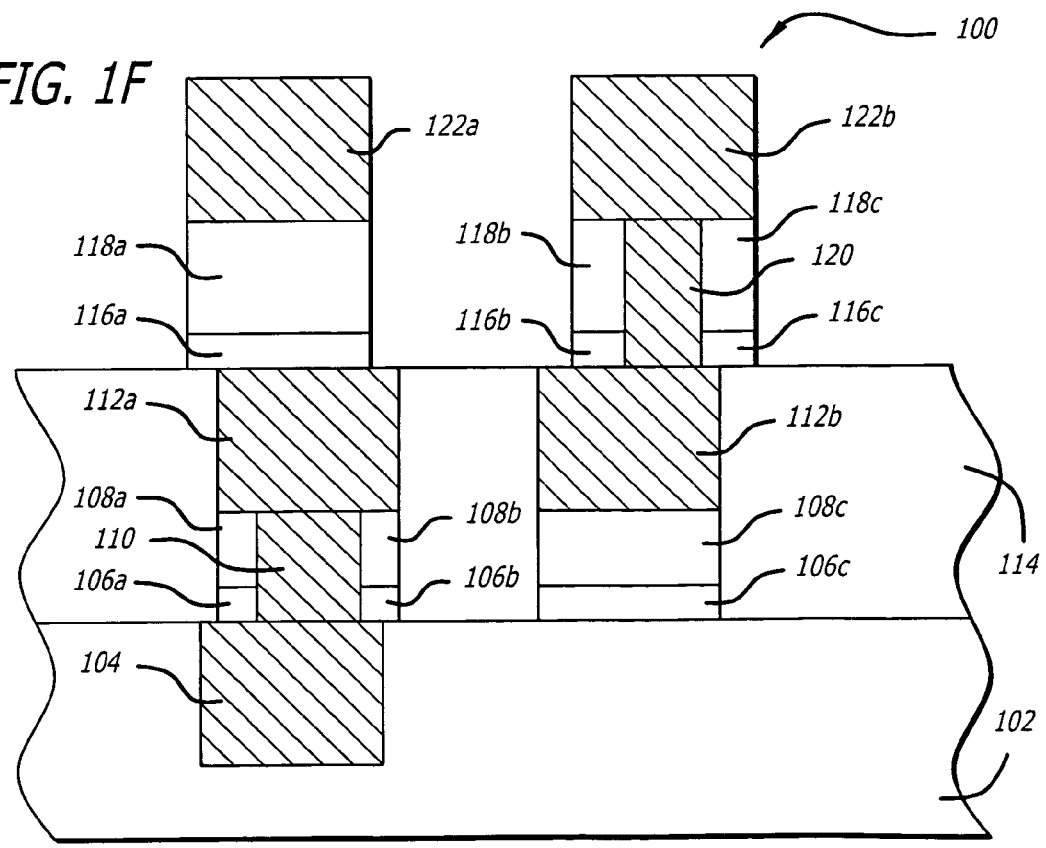

FIG. 1F illustrates a cross-sectional view of the exemplary semiconductor device 100 at a subsequent stage of the exemplary method of forming an air gap using an etch back of an ILD with self-alignment to metal pattern in accordance with an embodiment of the invention. After the third metallization layers 122a–b are formed, the third dielectric layer 118 and the second ESL 116 are removed except in the locations underlying respectively the third metallization layers 122a–b. This forms stacked ESL and dielectric supports 116a and 118a for the overlying third metallization layer 122a. Also formed are stacked ESL spacers 116b–c and dielectric spacers 118b–c on either side of the via interconnect 120 which assists in supporting the overlying third metallization layer 122b. An exemplary method of removing the second ESL 116 and the third dielectric layer 118 is by an anisotropic etching process.

Figure 1G:
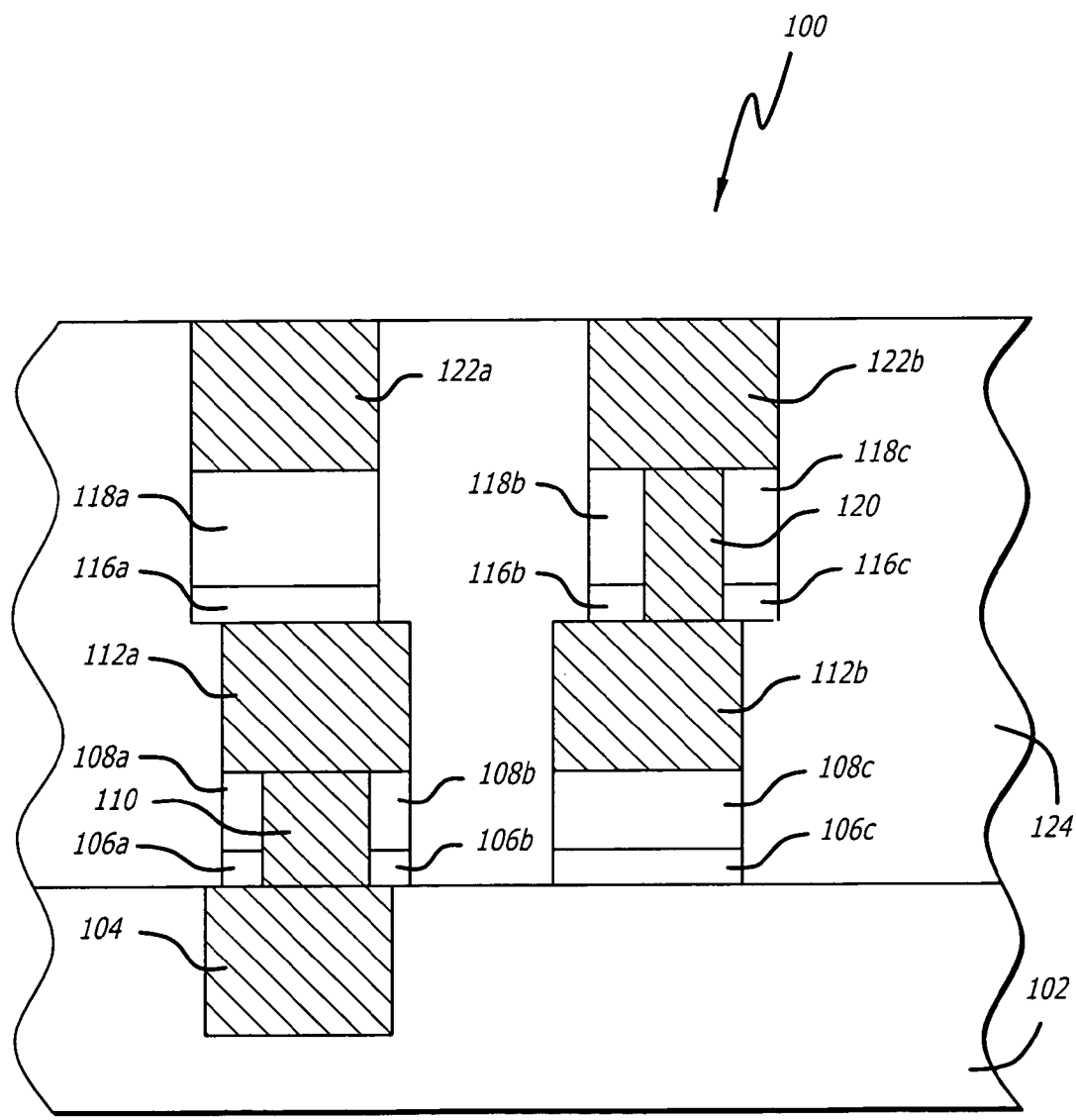

FIG. 1G illustrates a cross-sectional view of the exemplary semiconductor device 100 at a subsequent stage of the exemplary method of forming an air gap using an etch back of an ILD with self-alignment to metal pattern in accordance with an embodiment of the invention. After the third dielectric layer 118 and the ESL 116 are removed, a second sacrificial ILD is deposited over the first sacrificial ILD 114 to form a combined overall sacrificial ILD 124 situated over the first dielectric layer 102 and respectively between the second metallization layers 112a–b and third metallization layers 122a–b. In addition, after the combined sacrificial ILD 124 is formed, it is annealed at approximately 200° C., and polished back to expose the top surfaces of the third metallization layer 122a–b. As discussed above, the sacrificial ILD 124 can be formed of UNITY™ 400, SILK®, or FLARE, and the polishing of the ILD can be performed by CMP.

Figure 1H:
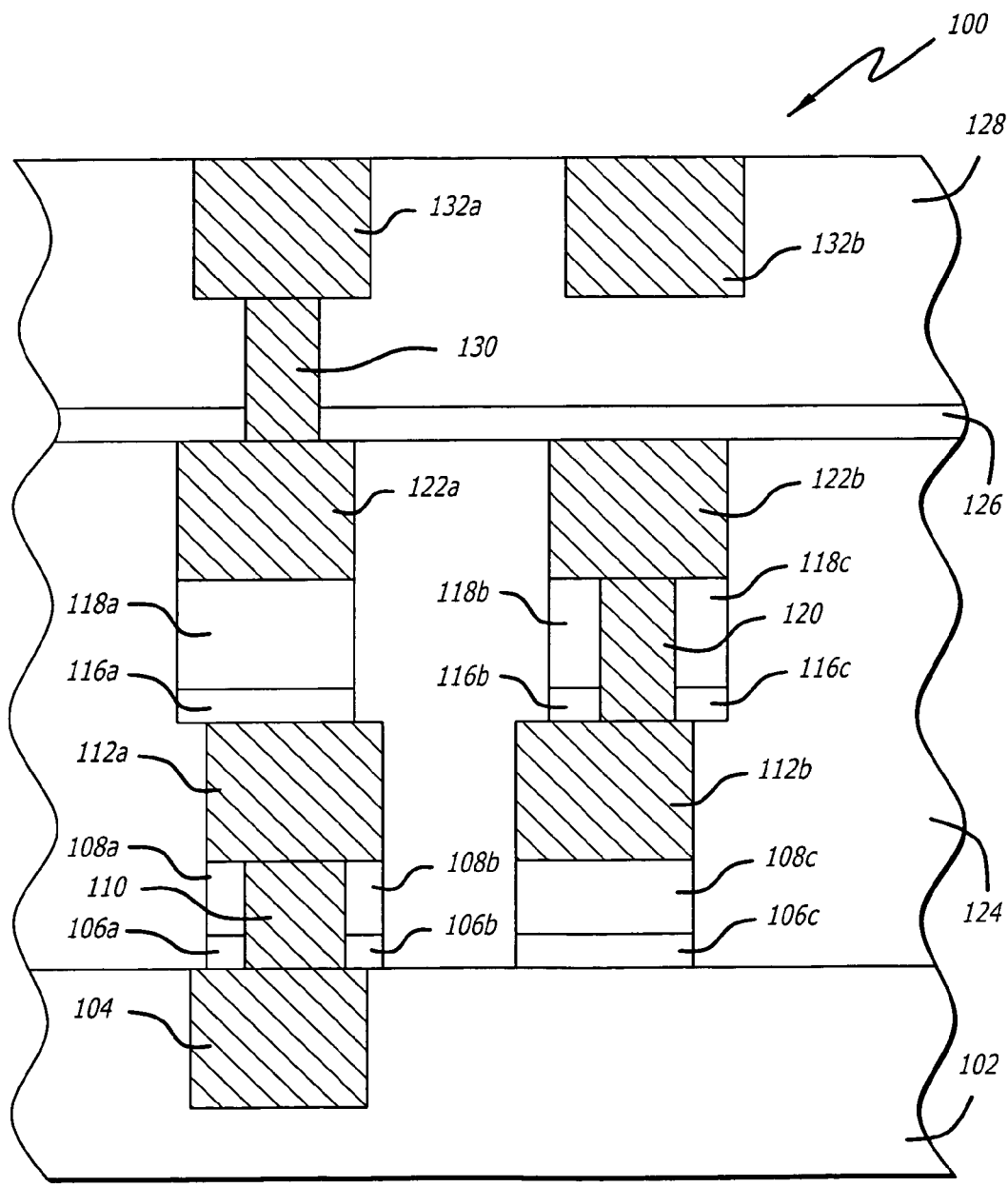

FIG. 1H illustrates a cross-sectional view of the exemplary semiconductor device 100 at a subsequent stage of the exemplary method of forming an air gap using an etch back of an ILD with self-alignment to metal pattern in accordance with an embodiment of the invention. After the sacrificial ILD 124 has been polished, a fourth metallization layer and interconnect are formed above the third metallization layers 122a–b in accordance with a dual metal damascene process. Specifically, the semiconductor device 100 further comprises a third ESL 126 (e.g. $Si_3N_4$) deposited over the sacrificial ILD 124 and the third metallization layers 122a–b, a fourth dielectric layer 128 (e.g. $SiO_2$) deposited over the third ESL 126, fourth metallization layers 132a–b (e.g. Cu) which are laterally (i.e. in the horizontal direction) spaced apart from each other and both formed within the fourth dielectric layer 128 pursuant to a dual metal damascene process, and a via interconnect 130 formed within the fourth dielectric layer 128 pursuant to a dual metal damascene process, and electrically connecting the fourth metallization layer 132a to the third metallization layer 122a.

Figure 1I:
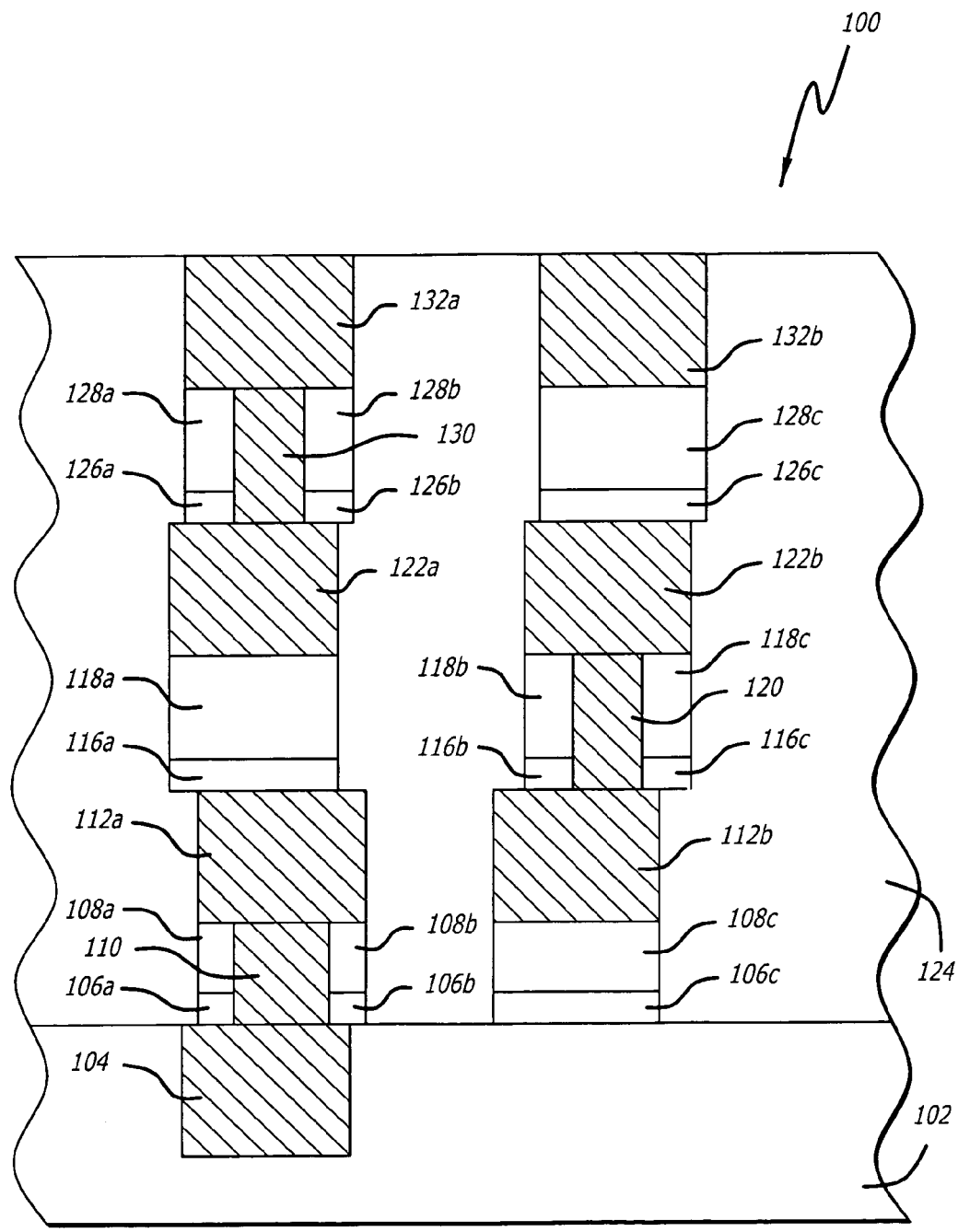

FIG. 1I illustrates a cross-sectional view of the exemplary semiconductor device 100 at a subsequent stage of the exemplary method of forming an air gap using an etch back of an ILD with self-alignment to metal pattern in accordance with an embodiment of the invention. After the fourth metallization layers 132a–b are formed, the fourth dielectric layer 128 and the third ESL 126 are removed except in the locations underlying respectively the fourth metallization layers 132a–b. This forms stacked ESL spacers 126a–b and dielectric spacers 128a–b on either side of the via interconnect 130 which assists in supporting the overlying fourth metallization layer 132a. This also forms ESL and dielectric supports 126c and 128c for the overlying fourth metallization layer 132b. An exemplary method of removing the third ESL 126 and the fourth dielectric layer 128 is by an anisotropic etching process. In addition, a third sacrificial ILD is deposited over the sacrificial ILD 124 and fourth metallization layers 132a–b to form a combined sacrificial ILD 134, which is subsequently polished to expose the top surfaces of the fourth metallization layers 132a–b.

Figure 1J:
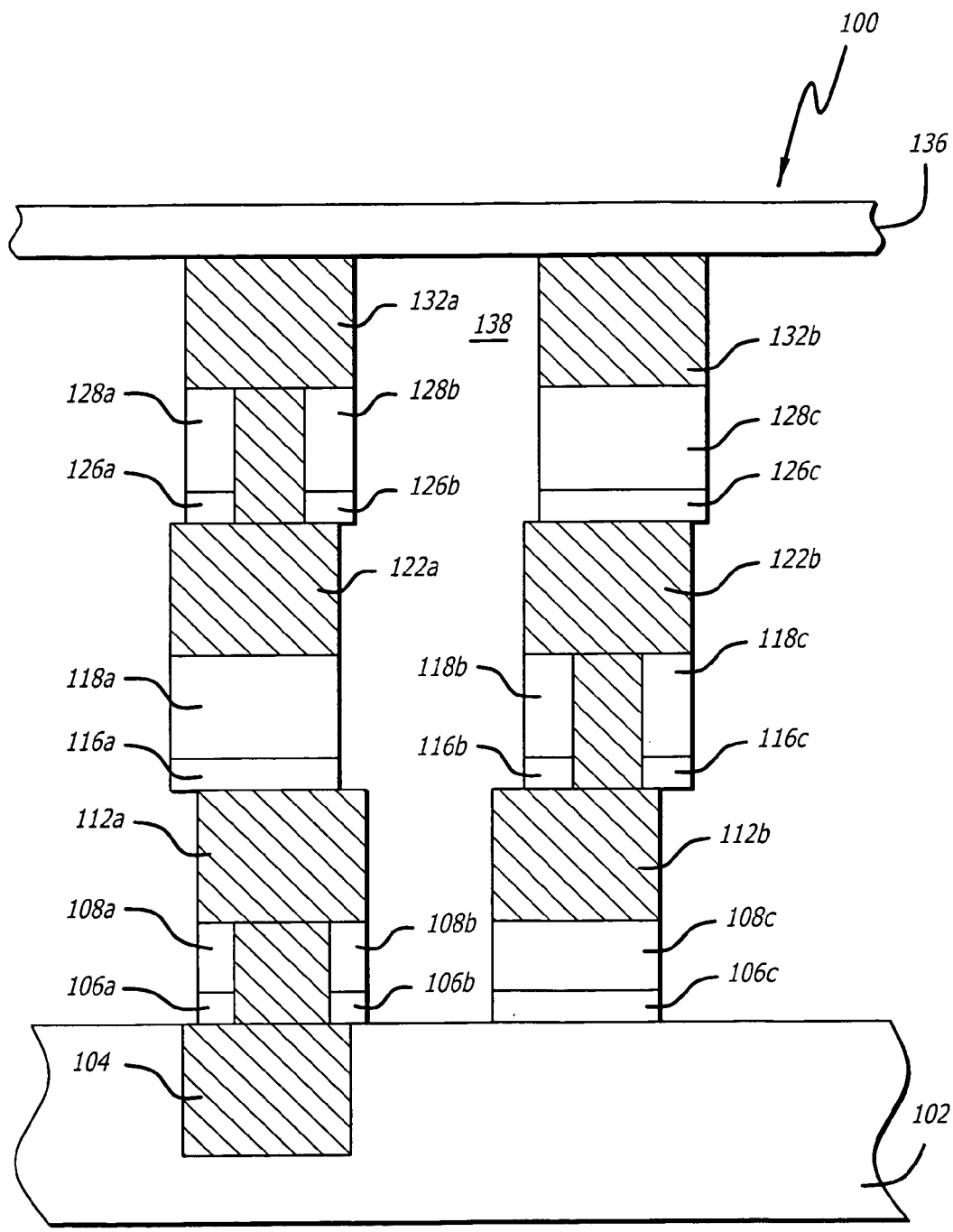

FIG. 1J illustrates a cross-sectional view of the exemplary semiconductor device 100 at a subsequent stage of the exemplary method of forming an air gap using an etch back of an ILD with self-alignment to metal pattern in accordance with an embodiment of the invention. After the polishing back of sacrificial ILD 134, a diffusion layer 136 (e.g. $SiO_2$, $Si_3N_4$, and/or Silicon Carbide (SiC)) is formed over the fourth metallization layers 132a–b and the sacrificial ILD 134. After the formation of the diffusion layer 136, the sacrificial ILD 134 is removed such that an air gap dielectric 138 is formed between respective same level metallization layers 112a–b, 122a–b, and 132a–b. In the case of UNITY™ 400 or other thermally decomposable materials, the sacrificial ILD 134 may be removed by thermally annealing to decompose the ILD material from a solid into a gas, and allow the gas to evaporate away. Non-thermally decomposing materials, such as FLARE® or SILK®, would need to be ashed away through the diffusion layer 136. In this manner, the formation of the air gap 138 self-aligns with the metal layers 112a–b, 122a–b, and 132a–b.

After the formation of the diffusion layer 136, additional layers and vias above the diffusion layer 136 could be formed, even with higher dielectric materials. Typically, the higher level metal layers do not need low dielectric constant integration schemes. This series of second through fourth metal layers integrate air gaps while the upper layers utilize conventional, higher dielectric constant ILD materials such as $SiO_2$. However, there is no limit on the number of air gap layers that can incorporate this integration scheme. Again the use of the air gap as an ILD instead of the typically $SiO_2$ lowers the capacitance coupling between adjacent metal lines, which may reduce the amount of cross-talk between adjacent metal lines and increase the bandwidth (or reduce time delay) between a signal-carrying metal line and a grounded metal line.

In the foregoing specification, the invention has been described with reference to specific embodiments thereof. It will, however, be evident that various modifications and changes may be made thereto without departing from the broader spirit and scope of the embodiments of the invention. The specification and drawings are, accordingly, to be regarded in an illustrative rather than a restrictive sense.

What is claimed is:

1. A device comprising:
    a first metallization layer patterned within a first dielectric layer;
    a second metallization layer patterned within a second dielectric layer;
    an interconnect patterned within the second dielectric layer and an etch stop layer (ESL) to couple the first metallization layer to the second metallization layer, the interconnect being exclusively bordered on at least two sides by spacers formed by portions of the second dielectric layer and the ESL remaining after removal of the ESL and the second dielectric layer to assist in supporting the second metallization layer;
    a third metallization layer patterned within the second dielectric layer, said third metallization layer is laterally spaced apart from said second metallization layer;
    a sacrificial inter layer dielectric (ILD) situated between said second and third metallization layers; and
    a diffusion layer extending from over said second metallization layer, said sacrificial ILD and said third metallization layer with said sacrificial ILD subsequently being removed to form an air gap between said second metallization layer and said third metallization layer.

2. The device of claim 1, wherein said diffusion layer comprises one of silicon dioxide, silicon nitride and silicon carbide.

3. The device of claim 1, wherein said sacrificial ILD is removed by thermally annealing to alter said sacrificial ILD from a solid form to a gaseous form and allowing said gaseous form to evaporate.

4. The device of claim 1, wherein said spacers being formed by said portions of said ESL and said second dielectric layer situated directly under said second metallization layer.

5. The device of claim 1, wherein said first dielectric comprises silicon dioxide.

6. The device of claim 1, wherein said etch stop layer is deposited under said second dielectric layer.

7. The device of claim 6, wherein said etch stop layer being further deposited over said first dielectric layer.

8. The device of claim 1, wherein said spacers are in physical contact with said second metallization layer.

* * * * *